United States Patent [19]
McLaughlin et al.

[11] Patent Number: 4,831,624
[45] Date of Patent: May 16, 1989

[54] ERROR DETECTION METHOD FOR SUB-BAND CODING

[75] Inventors: Michael J. McLaughlin, Palatine; Phillip D. Rasky, Buffalo Grove, both of Ill.

[73] Assignee: Motorola, Inc., Schaumburg, Ill.

[21] Appl. No.: 177,300

[22] Filed: Apr. 4, 1988

Related U.S. Application Data

[63] Continuation-in-part of Ser. No. 058201, Jun. 4, 1987, Pat. No. 4,805,193, and Ser. No. 058,202, Jun. 4, 1987, Pat. No. 4,802,171.

[51] Int. Cl.$^4$ .............................................. G06F 11/10
[52] U.S. Cl. ........................................ 371/37; 371/31; 381/46
[58] Field of Search ...................... 371/31, 37; 381/31, 381/46

[56] References Cited

U.S. PATENT DOCUMENTS

| | | | |
|---|---|---|---|
| 4,048,443 | 9/1977 | Crochiere et al. ...................... | 381/37 |
| 4,216,354 | 8/1980 | Esteban et al. ......................... | 381/31 |
| 4,291,405 | 9/1981 | Jayant et al. ........................... | 371/31 |
| 4,375,581 | 3/1983 | Jaynant . | |
| 4,455,649 | 6/1984 | Esteban et al. ......................... | 370/80 |
| 4,464,782 | 8/1984 | Beraud et al. .......................... | 381/31 |
| 4,516,258 | 5/1985 | Ching et al. ............................ | 381/31 |
| 4,622,680 | 11/1986 | Zinser .................................. | 381/31 X |
| 4,688,224 | 8/1987 | Dal Degan et al. ................... | 371/31 |

OTHER PUBLICATIONS

Aarskog, et al., "Real-Time Implentation of a 16 KBIT/s Speech Coder/Decoder Using Adaptive Sub--Band Coding Together with Time Domain Harmonic Scaling", *Nordic Seminar on Digital Land Mobile Radiocommunication*, (Feb. 5–7, 1985), pp. 27–34.
Ahlin, "Coding Methods for the Mobile Radio Channel", *Nordic Seminar on Digital Land Mobile Radiocommunication*, (Feb. 5–7, 1985), pp. 185–194.
Chien, "Memory Error Control: Beyond Parity", *IEEE Spectrum*, (Jul. 1973), pp. 18–23.
Chu, P., "Quadrature Mirror Filter Design for an Arbitrary Number of Equal Bandwidth Channels" *IEEE Trans. Acoust., Speech, Signal Processing*, vol. ASSP-31, pp. 203–218, Feb. 1985.
Kaltenmeier, et al., "A Subband Coder for Digital Speech Transmission in the Digital Cellular Radio Telephone System CD900", *Nordic Seminar on Digital Land Mobile Radiocommunication*, (Feb. 5–7, 1985), pp. 279–285.
Kittel, "Channel Coding for Digital Public Land Mobile Networks", *Nordic Seminar on Digital Land Mobile Radiocommunication*, (Feb. 5–7, 1985), pp. 57–66.
Max, J., "Quantizing for Minimum Distortion", *IRE Trans. Inform. Theory*, pp. 7–12, Mar. 1960.
McLaughlin, "Comparison of Sub-Band Coding and Adaptive Predictive Coding for Land Mobile Radio" *Nordic Seminar on Digital Land Mobile Radiocommunication*, (Feb. 5–7, 1985), pp. 115–124.
McLaughlin, et al., "Speech and Channel Coding for Digital Land–Mobile Radio", *IEEE Journal on Selected Areas in Communications*, vol. 6, No. 2, (Feb. 1988), pp. 332–345.
McNamara, John E., *Technical Aspects of Data Communications*, 2nd ed. (Bedford, MA: Digital Press, 1982), pp. 110–112.

*Primary Examiner*—Charles E. Atkinson
*Attorney, Agent, or Firm*—Douglas A. Boehm; Charles L. Warren; Anthony J. Sarli, Jr.

[57] ABSTRACT

A method and apparatus is disclosed for improving the quality of speech samples communicated via sub-band coding utilizing adaptive bit allocation, by providing error detection only on the adaptive bit allocation information. A first error detection code, such as a cyclic redundancy check (CRC), is calculated on the bit allocation parameters in the transmitter and sent to the receiver, where a second error detection code is calculated based upon the reconstructed bit allocation parameters. The transmitted error detection code is then used to determine if the received bit allocation information is correct, and if not, the frame of speech data is discarded. By protecting only the bit allocation information, additional speech frames may be salvaged from the error-prone channel, thus further increasing speech intelligibility.

39 Claims, 10 Drawing Sheets

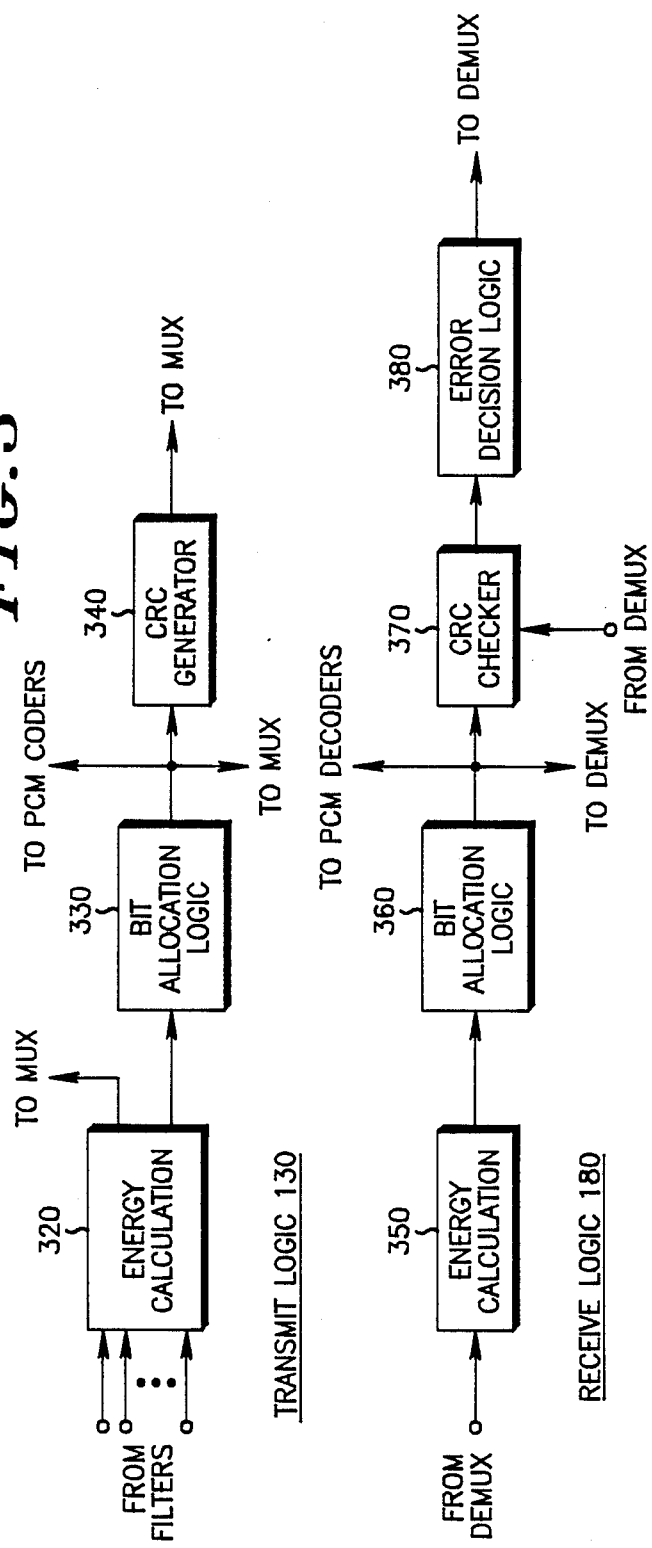

ERROR DETECTION METHOD FOR SUB-BAND CODING

This application is a continuation-in-part of application Ser. No. 07/058,201,; now U.S. Pat. No. 4,805,193, issued 2/14/89 and application Ser. No. 07/058,202, now U.S. Pat. No. 4,802,171, issued 1/31/89, both filed June 4, 1987.

BACKGROUND OF THE INVENTION

The present invention generally relates to the field of digital speech communications systems. More specifically, the present invention pertains to an improved and efficient method of providing error detection capabilities in a sub-band coder without significantly increasing the required bit rate over the channel.

Recently, there has been a significant interest in the use of digital speech transmission in land-mobile radio channels. The use of digitally-encoded speech provides the advantages of: facilitating voice privacy/security measures such as encryption; maintaining compatibility with data transmission equipment; permitting the use of modern transmission techniques such as optical communications; facilitating channel-reuse techniques for spectral efficiency; and improving speech quality in adverse environments through the use of digital error protection codes.

Those skilled in the RF communications field appreciate the unique problems faced in providing digital communications over an RF channel. Rapid multipath fading, commonly experienced in high frequency radiotelephone communications, causes significant amplitude and phase changes in the digital bit stream such that data carried by the radio channel becomes garbled and missing. Additionally, co-channel interference, ignition noise, and landline telephone network impairments further degrade the signal quality in a land-mobile radio communications system. Moreover, the audio quality of digitally-encoded speech must be maximized while at the same time maintaining reasonable data rates, system complexity, and equipment costs.

Known techniques for maintaining high quality speech though error-prone channels typically involve significant tradeoffs. For example, the simplest way to correct channel errors is to re-send the original signal upon request by the receiver, e.g., as presently done in Automatic Repeat Request (ARQ) protocols of data communications systems. This method, however, precludes implementation in real time because of the time delays necessary to implement the protocol. Alternatively, error detection and correction may be provided for all of the bits in the data stream through the use of redundancy, as is commonly done in cellular signalling. The addition of redundancy necessitates increasing the data rate, by perhaps a factor of two, to accommodate the error protection coding. However, today's channel spacing specifications for mobile radio systems preclude the use of data rates above 16 kilobits-per-second (kbps).

Several speech coding techniques have been suggested for data rates between 9.6 kbps and 16 kbps. These techniques include adaptive sub-band excited transform coding, continuously variable slope delta (CVSD) modulation, adaptive transform coding, multipulse linear predictive coding (LPC), vector-excited LPC, and sub-band coding (SBC). For many of these coding schemes, the speech quality at a low data rate may not be acceptable for use with land-mobile radio systems. Other coding schemes reduce the bit rate through the use of vector quantization of the band energies via the use of a codebook. However, the additional computations required to search the codebook introduce additional delay and complexity into the system. Hence, a tradeoff between system complexity, data rate, and speech quality must be made.

A need, therefore, exists to provide a method for maintaining the accuracy of digitally-encoded speech using a minimum amount of added error protection coding so as to avoid any significant increase in data rate.

SUMMARY OF THE INVENTION

Accordingly, a general object of the present invention is to provide a method and means for maintaining speech quality and intelligibility over an RF channel which is subject to various types of errors.

Another object of the present invention is to maintain satisfactory speech quality without significantly increasing the data rate over the channel.

These and other objects are achieved by the present invention, which, briefly described, is a method for improving the quality of speech samples communicated via sub-band coding utilizing adaptive bit allocation by providing error detection only on the bit allocation information. A first error detection code, such as a cyclic redundancy check (CRC), is calculated on the bit allocation parameters in the transmitter, and this error detection information is transmitted to the receiver. Upon reception, the bit allocation parameters are reconstructed from the transmitted energy information, and a second error detection code is calculated based upon these reconstructed bit allocation parameters. The first error detection code is then compared to the second error detection code in order to determine if the received bit allocation information is correct. If the bit allocation information is not correct, that frame of speech data is discarded and replaced with the previous frame or the speech frame is muted.

The bit allocation information provides a highly reliable indicator of the ability of the receiver to reconstruct intelligible speech in the presence of channel errors. By protecting the bit allocation information, an error is detected only if the received bit allocations are incorrect, indicating that the speech frame is hopelessly corrupted. As is often the case, however, the individual bit errors in the transmitted energy information may not necessarily corrupt the bit allocation information, and thus may not significantly degrade the quality of the reconstructed speech. Hence, by protecting only the bit allocation information, additional speech frames may be salvaged from the error-prone channel. In this manner, excessive frame repeating or muting is avoided, further increasing the speech intelligibility.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like-referenced numerals identify like elements,, and in which:

FIG. 3 is a detailed block diagram of the transmit and receive logic blocks of the sub-band coding system of FIG. 1 in accordance with the present invention;

DETAILED DESCRIPTION OF THE PREFERRED EMBODIMENT

Figure 1:
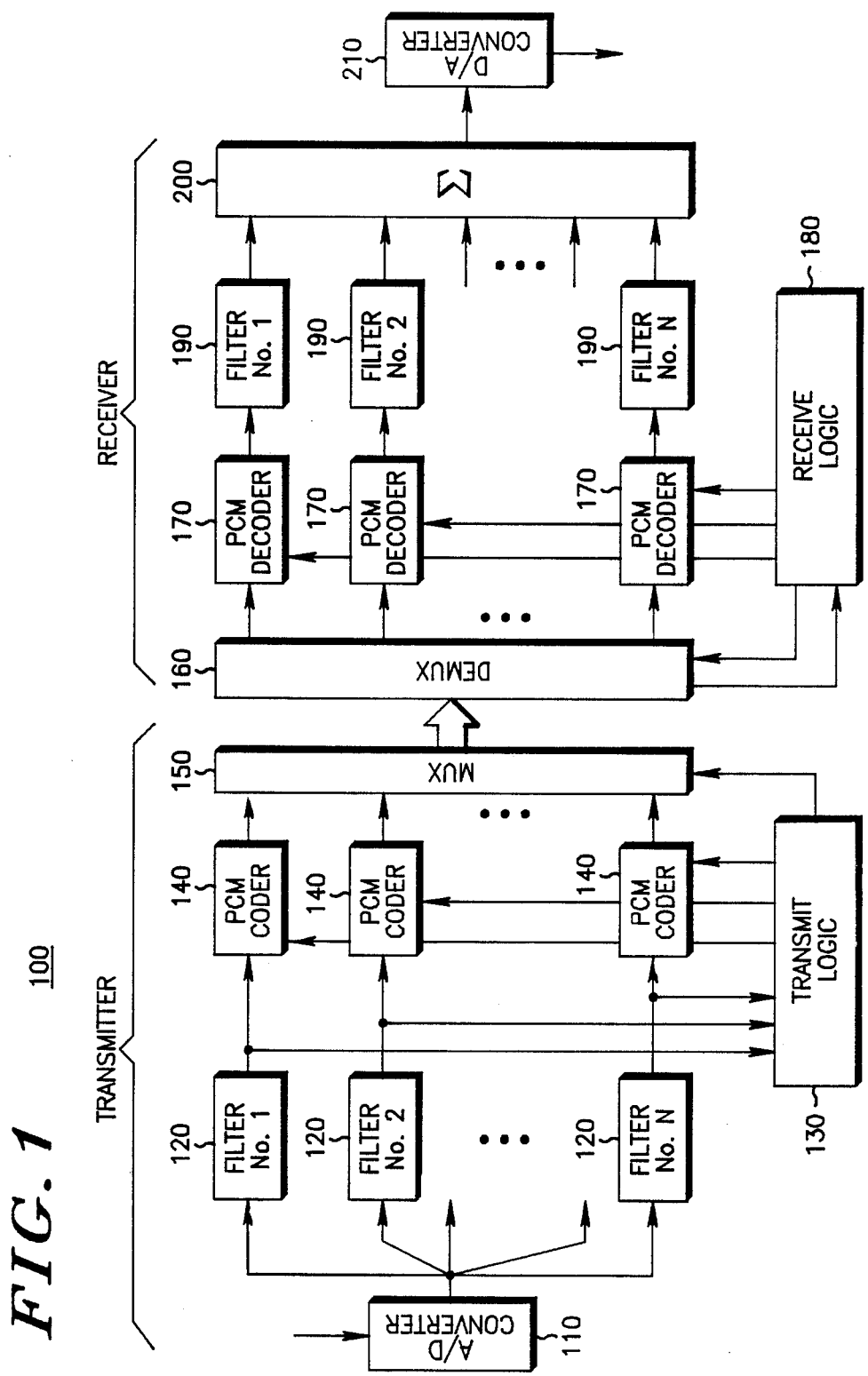
FIG. 1 is a general block diagram of a sub-band coding system for use with the present invention.

The preferred embodiment of the present invention is described in FIG. 1 in terms of sub-band coding, due to its high speech quality and minimal complexity at a 12 kbps data rate. It is contemplated, however, that the techniques disclosed herein may be applicable to other channel coding schemes, as well as for other types of input signals.

In general, the process of sub-band coding involves dividing the speech signal into non-overlapping frequency bands, and coding each of these sub-band signals individually. A sub-band coding system includes a transmitter—which encodes the input signal, typically a speech signal, into a digital bit stream for transmission over a communications channel, and a receiver—which decodes the digital bit stream so as to provide a reconstructed speech signal for the user.

In the transmitter, the sub-band coder divides the input signal into a number N of non-overlapping frequency bands using the equivalent of a parallel filter bank. The output from each filter is digitally encoded using a quantizer, and then multiplexed onto the channel. Generally, the transmitted data stream consists of two types of information: (1) side information, which conveys the amount of energy present in each band; and (2) sample information, which conveys the quantized sample values for each band.

The receiver decodes the side information, such that the data stream corresponding to the speech sample information can then be demultiplexed. The sample values are then decoded and applied to the appropriate sub-band filter. The outputs of the filters are then summed together to produce the reconstructed speech signal at the original sampling rate.

In a sub-band coder utilizing adaptive bit allocation, the number of bits used to quantize the signal in each band is determined by the amount of energy in the signal from a particular band relative to the amount of energy in the other bands. The bands with greater energy content are typically coded with more bits per sample, to accommodate the greater dynamic range for those signals. Since the number of bits allocated to the sample coding determines the level of quantization noise, the quantization noise can be made to vary from band to band. This allows the quantization noise to be shaped to follow the speech spectrum and hide its presence below the level of speech signal. In other words, by suppressing low power sub-bands and adaptively allocating an extra bit to individual sub-bands having higher energy, the total quantization noise can be decreased, and the quality of the speech can be improved.

Errors due to channel impairments in the speech sample information are perceived as noise in the reconstructed speech signal, wherein the intensity of the noise is somewhat proportional to the amount of the sample information being corrupted. However, errors in the energy information can cause very significant speech degradation even if only a small portion of the information is corrupted, since if only one energy code is incorrect, the bit allocation for that band, as well as perhaps several other bands, would be incorrect. Even if only the bit allocation assignments for two bands are incorrect, all the sample codes for several other bands can be effected. This degradation produces a noise burst in the speech that lasts as long as the frame time, which in the preferred embodiment is 30 milliseconds. To minimize this loss of intelligibility, it is necessary to either discard the frame and repeat the previous frame of speech data, or just mute the audio for one frame. The chief disadvantage of omitting the corrupted frame is that too many intelligible frames are also discarded, since not all errors in the energy information cause an objectionable degradation in speech quality.

Referring now to FIG. 1, there is shown a general block diagram of adaptive bit allocation sub-band coder 100 for use with the present invention. An analog input signal, such as a speech signal, is converted into a sequence of pulse samples, and the amplitude of each pulse sample is then represented by a digital code in analog-to-digital (A/D) converter 110, as known in the art. The sampling rate for the preferred embodiment is 8 kHz The digital output of A/D 110 is then divided into N separate frequency bands by passing the speech samples through a bank of parallel filters 120. The purpose of separating the speech signal into bands is to allocate the bits used for coding the speech signal among the bands such that the individual sub-band quantizers can be adaptively adjusted to the current power of their respective sub-bands. In the preferred embodiment, N is equal to 16 bands. Refer to the article entitled "Quadrature Mirror Filter Design for an Arbitrary Number of Equal Bandwidth Channels" by P. Chu, *IEEE Trans. Acoust., Speech and Signal Processing*, Vol. ASSP-31, pp. 203–218, Feb. 1985, for representative filter specifications.

Since the output samples from the filters are band limited to 1/N of the original input signal bandwidth, the sampling rate can be reduced by N. In the preferred embodiment, this downsampling operation is performed in the filter calculations themselves. In essence, only every N-th output sample is computed by these decimating filters.

The output from each filter 120 is digitally encoded in its respective pulse-coded modulation (PCM) coder 140. PCM coder 140 for band (i) is essentially an A(i)-bit quantizer, wherein the bit allocation assignment A(i) varies from band-to-band and from frame-to-frame in accordance with the relative energies of the bands. Once the bit allocations for the PCM coders have been determined, the samples from each filter are normalized to unit variance, and passed to the quantizer. The quantizer is a minimum mean-square error quantizer, wherein the number of quantization levels is $2^{A(i)}$ The PCM coded speech samples are then applied to multiplexer 150. The article entitled "Quantizing for Minimum Distortion" by J. Max, *IRE Trans. Inform. Theory*, pp. 7–12, Mar. 1960, describes a quantizer which may be used as PCM coder 140.

The bit allocation assignments among the sub-bands are controlled by transmit logic block 130. As will be explained in further detail in accordance with FIG. 4, the bit allocations are proportional to the amount of energy in a particular sub-band relative to the amount of energy in the other sub-bands. This adaptive bit allocation process locates the band having the largest energy, assigns that band one more bit per sample process until all of the bits available for coding have been allocated. Hence, based on the coded energy values, the number of bits allocated to coding of the samples from each band is determined.

Transmit logic 130 also computes an error detection code, such as a CRC, over the bit allocation parameters. This process will be described in detail in the flowchart of FIG. 5. Transmit logic 130 outputs the CRC and the individual band energies to multiplexer 150, and the bit allocation parameters to PCM coders 140. Since the bit allocation parameters can be reconstructed from the received energy information, the bit allocation information is never explicitly transmitted.

In the receiver, the digital bit stream is subdivided into frames by demultiplexer 160. The adaptive bit allocation assignments are recomputed from the side information in receive logic 180, as will be described in the flowchart of FIG. 4.

Receive logic 180 also checks the CRC code to verify that no errors have occurred in the transmission of the data stream which would have corrupted the bit allocation assignments. If no errors have occurred, receive logic 180 instructs multiplexer 160 to send the current frame samples to the appropriate PCM decoder 170. If errors have occurred in transmission, receive logic 180 instructs demultiplexer 160 to discard the frame. The audio would then be muted during this short frame time period. If multiplexer 160 includes a 1-frame memory, the last previous un-corrupted frame of speech data could be substituted in place of the corrupted frame (which would create less of a degradation of the speech quality.) This error control process is described below in accordance with FIG. 6.

Each PCM decoder utilizes the bit allocation assignments provided by receive logic 180 to decode the speech samples. The sub-band samples are returned to the original sampling rate by an interpolation process that inserts N−1 zero-valued samples between each of the decoder sample output values, and passes them through the corresponding bandpass filter 190. The zero padding causes the spectrum of the band-limited signal to be replicated across the full bandwidth, and the filter removes all but the one replication that occurs at the correct frequency. The outputs of the sub-band filters are finally summed in network 200 to produce the reconstructed speech signal at the original 8 kHz sampling rate. An analog speech signal is then output by D/A converter 210.

Figure 2:
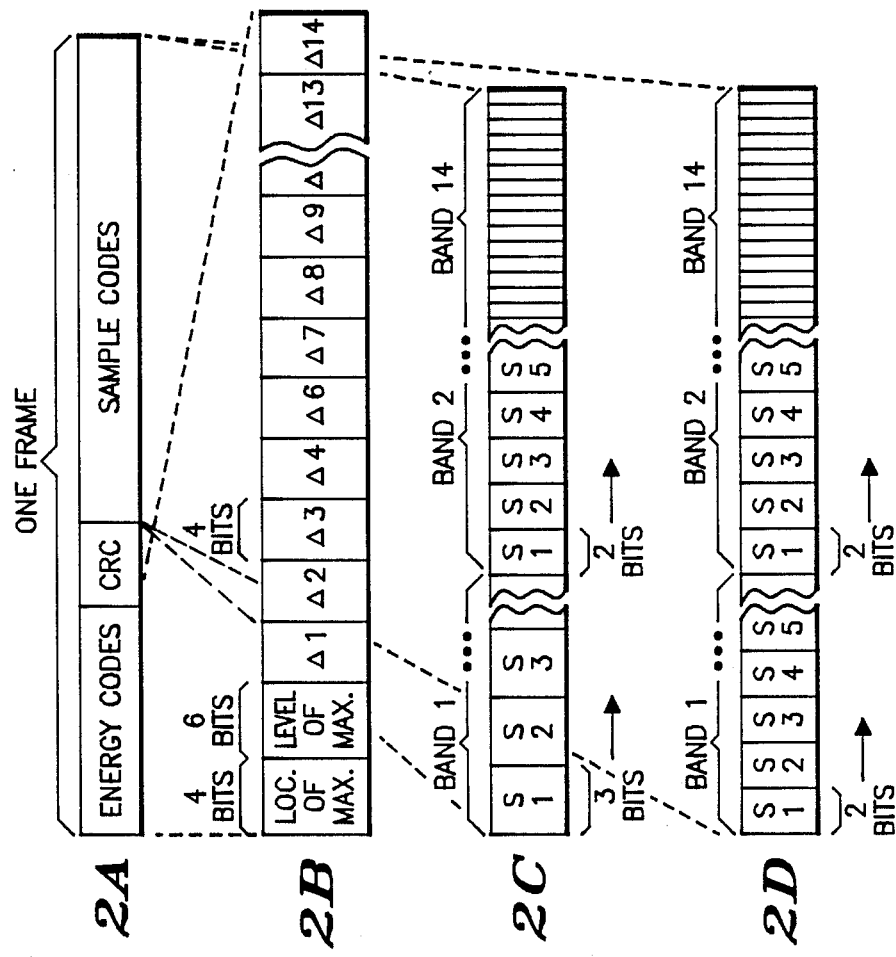
FIG. 2A is a timing diagram illustrating the frame and slot time relationships of the transmitted sub-band coded signal in accordance with the present invention.
FIG. 2B is a timing diagram illustrating a proposed coding scheme for the energy code time slot of FIG. 2A.
FIG. 2C is a timing diagram illustrating the sample code information for each band having the bit allocations as seen at the transmitter.
FIG. 2D is a timing diagram illustrating the same sample code information as shown in FIG. 2C having the corrupted bit allocations as seen at the receiver.

FIG. 2A illustrates the format of one frame of the transmitted bit stream. The figure shows that the frame is divided into three time slots: energy codes, error detection codes, and sample codes.

FIG. 2B is an exploded diagram of the energy code time slot. In the preferred embodiment, Delta coding is used to code the energies of the N bands. Since N=16 in the preferred embodiment, a four-bit code is used to represent the number of the sub-band which has the largest energy. This four-bit code is sent first, as the "location of the maximum band." A six-bit code, representing the level of the energy in the band having the maximum energy, is sent next as the "level of the maximum band". This six-bit code represents the energy in 1 dB increments. The energies for the remaining bands are Delta-coded by representing the difference in energy in 2 dB steps from the adjacent band. In the preferred embodiment, these codes are computed beginning at the maximum band, and working outward to the first and last bands. By way of illustration, FIG. 2B shows that band No. 5 has been determined to contain the maximum energy, since there is no Delta code location for band No. 5. The Delta codes are transmitted in ascending band order having four bits per Delta code. Since the energy in the bands adjacent to the maximum band are never larger than that of the maximum band, the Delta codes for these bands are always non-negative, and can be represented as a three-bit code. The speech is low pass filtered to 3.5 kHz prior to sampling such that bands 15 and 16 contain relatively little energy and are not transmitted. Hence, the total number of bits for this side information is 60 bits per frame.

The CRC error detection code is transmitted next in the frame. In the preferred embodiment, a cyclic redundancy check code having eight bits is utilized. However, it is contemplated that numerous other types of error detection codes can be utilized, e.g., block codes, BCH codes, Hamming codes, or simple parity codes. Generation of the CRC code will be described in detail in the flowcharts.

Sample codes are sent next in the frame. FIG. 2C illustrates representative bit allocations for the sample codes of the 14 coded bands, as seen at the transmitter. In the example shown in this figure, the encoder has assigned three bits to the samples for band No. 1, and two bits for the samples of band No. 2.

At the receiver, however, a single bit error in the energy code for band No. 1 can cause the decoder to assign only two bits per sample for band No. 1, as illustrated in FIG. 2D. Accordingly, all the sample code values used at the decoder would then be incorrect, since the decoder extracts a two-bit code from the bit stream for band No. 1 instead of a three-bit code. Even if the decoder correctly determines from the energies that band No. 2 has been allocated two bits, the samples will not be extracted from the bit stream from the correct place based on the mistaken samples from the previous band. Depending on the extent of the corruption on the information, it is likely that nothing useful will be salvaged from the entire frame of sub-band samples. Ironically, however, the samples themselves may be error free.

The present invention, however, utilizes the received error detection code to determine whether or not the bit allocations have been corrupted. This technique is based on the realization that the bit allocation information provides a highly reliable indicator of the ability of the receiver to provide intelligible speech in the presence of channel errors. An error is detected only if the reconstructed bit allocations are incorrect, as opposed to if the bits of the energy codes are incorrect. If an error is detected in this bit allocation information, receive logic block 180 instructs demultiplexer 160 to discard the frame, as described above. This technique eliminates the annoying noise burst that occurs when the energy information is corrupted. Since, excessive frame repeating or muting also reduces speech intelligibility, the present invention limits this occurrence to only frames where the speech is likely to be severely corrupted. Moreover, the present error detection technique is very efficient, since it only takes eight additional bits of CRC code to provide error detection capability. This is a significant improvement in data rate over some prior art error protection techniques.

FIG. 3 illustrates a block diagram of both transmit logic block 130 and receive logic block 180. Both logic blocks perform three basic functions: (1) energy calculation; (2) bit allocation; and (3) CRC code generation. The operation of both transmit logic block 130 and receive logic block 180 will be described in terms of a flow diagram in subsequent figures.

In the transmitter logic block, the sub-band output from filters 120 are applied to energy calculator 320. Energy calculator 320 measures the energy $E(i)$ of each sub-band (i), wherein $1 \leq i \leq N$, and wherein N equals the number of sub-bands. These measured energy values are then quantized as quantized energy values $Q(i)$, and coded into a four-bit energy code $C(i)$ relative to the previous band's coded energy. The quantized energy values $Q(i)$ are applied to bit allocation logic block 330, and the energy codes $C(i)$ are fed to multiplexer 150 for transmission over the channel. Quantized energies $Q(i)$ are used in place of the actual energy values $E(i)$ in bit allocation logic block 330 so as to derive the same bit allocation as receiver bit allocation logic block 360 would generate using the received energy codes.

Bit allocation logic block 330 determines the bit allocation parameters $A(i)$ for PCM coders 140, so as to perform the adaptive bit allocation process. As will be described below, the samples from sub-bands having a greater energy content will be allocated extra bits for coding.

The bit allocation parameters $A(i)$ are also applied to CRC generator 340, which produces the transmit error detection code CRC(tx). In the present embodiment, CRC(tx) is a eight-bit Cyclic Redundancy Check code computed over the bit allocation information. The CRC code generally consists of eight parallel bits as applied to multiplexer 150. The CRC(tx) code is generated based upon only the bit allocation parameters $A(i)$, as opposed to error coding the entire energy codes $C(i)$. This error detection technique provides a simple, yet effective means of error control when the transmitted data is subject to channel errors. As will be known to those skilled in the art, any error detection code can be used to perform the same function as a CRC code.

On the receiver side, receive logic block 180 obtains the energy codes from demultiplexer 160, and applies them in parallel to energy calculator 350. These received energy codes will be designated $C'(i)$, since they may be corrupted by errors in the channel. The $C'(i)$ used to calculate the quantized energy values $Q'(i)$ in the same manner as was done in energy calculator 320 for the transmit logic block. The quantized energy values $Q'(i)$ are applied to receive bit allocation logic block 360.

The same steps are performed in bit allocation logic block 360 to generate the bit allocation parameters from the quantized energy values as was performed on the transmit side. The reconstructed bit allocation parameters $A'(i)$ are applied to demultiplexer 160 for sub-band sample framing, and to PCM decoders 170 for demodulation of the signal sample codes.

CRC code checker block 370 uses the reconstructed bit allocations to generate second error detection code CRC(rx). Unlike the CRC(tx) code, the error detection code CRC(rx) is calculated over both the reconstructed bit allocations $A'(i)$ and the received version of the transmitted CRC code, i.e., CRC'(tx). CRC(rx) will be zero if no errors have occurred in transmission. If this is not the case, error decision logic block 380 outputs a flag to demultiplexer 160 indicative of an error in transmission. The flag instructs the demultiplexer to either mute the frame of speech or to substitute the current frame of speech with the previous frame.

Figure 4A:
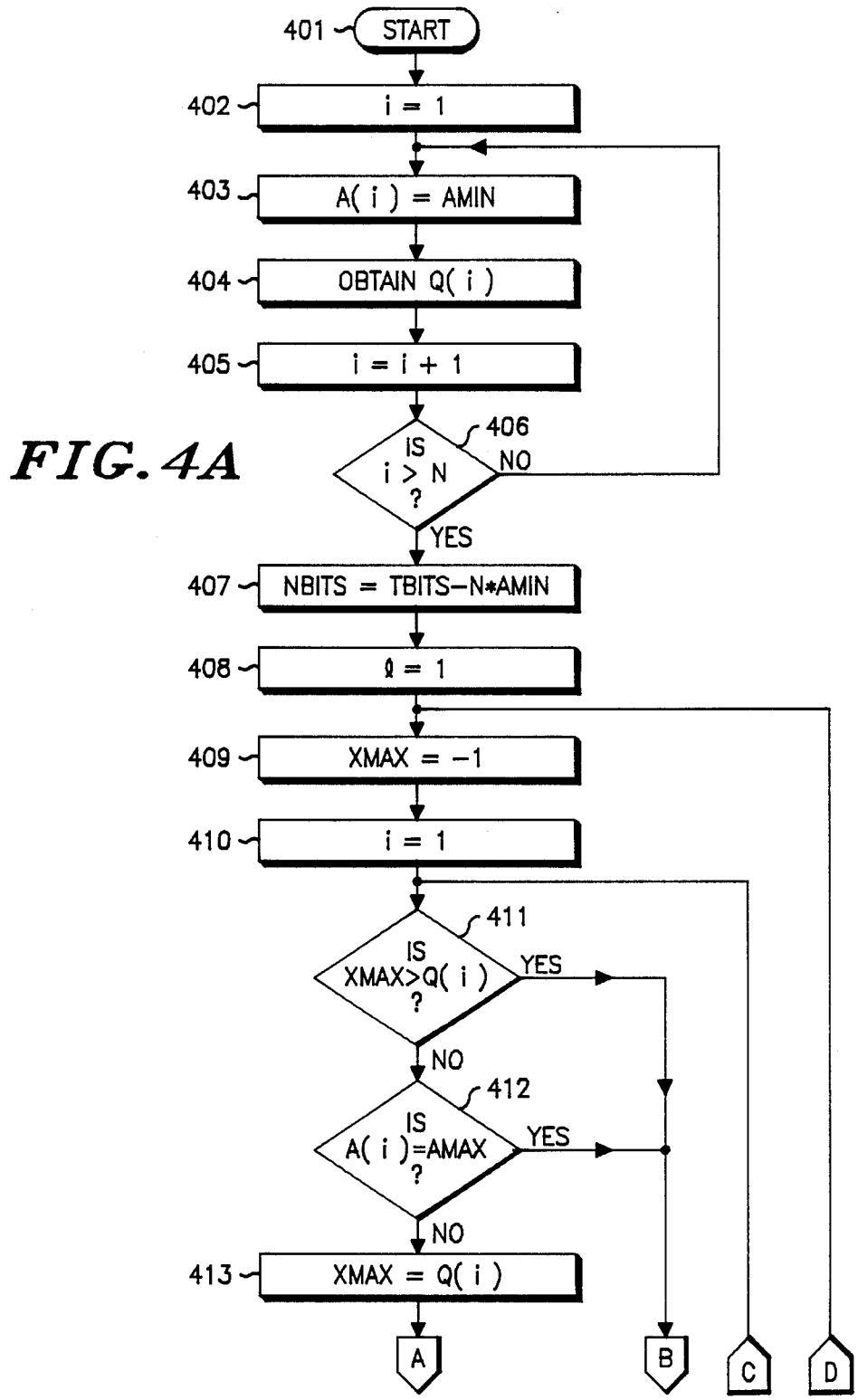
FIG. 4, comprised of FIGS. 4A and 4B, is a simplified flowchart diagram illustrating the general sequence of operations performed by the transmit and receive logic blocks.
Figure 4B:
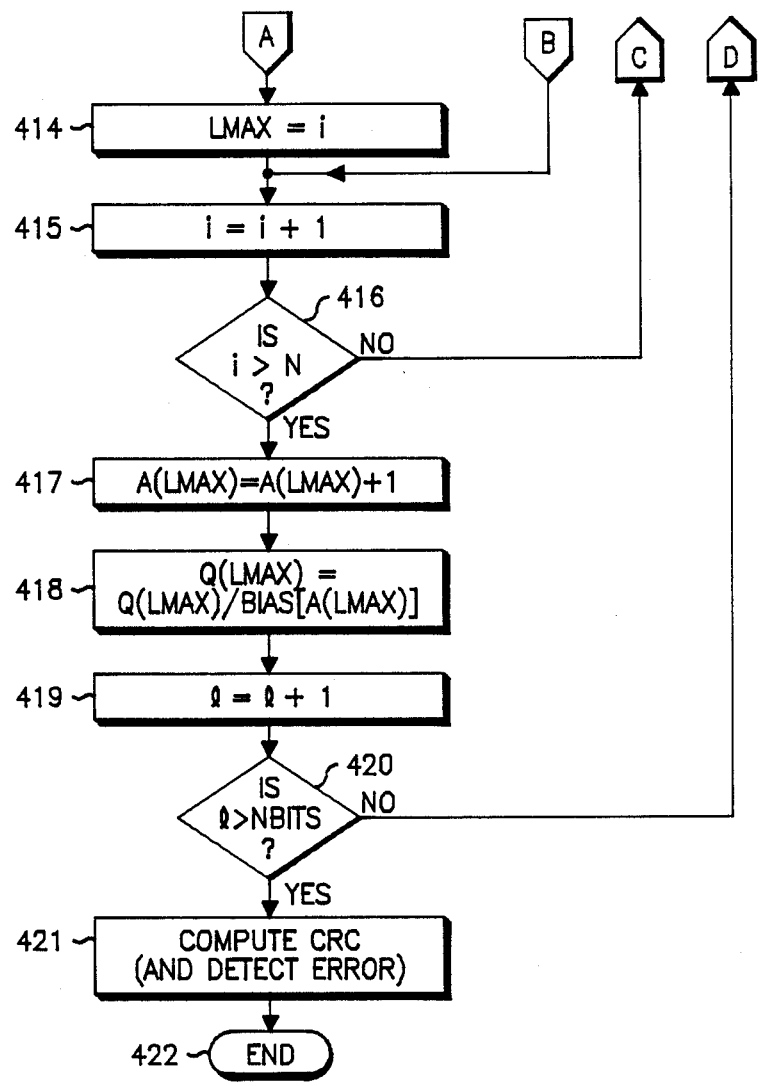

Referring now to FIG. 4, the operation of both transmit logic block 130 and receive logic block 180 are described in the single flowchart, since the basic energy calculation, bit allocation parameter generation, and CRC code generation steps are the same. Two differences exist, however, in the respective operations of the transmit and receive logic. First, energy calculator 320 performs the additional step of calculating the energies from the filter samples and quantizing these calculated energy values $E(i)$. Energy calculator 350 does not have to perform this function, since it operates solely from the energy codes $C'(i)$ transmitted over the channel. Secondly, minor differences exist in computing and checking the different CRC error detection codes. These differences will be explained in detail below.

Starting with step 401, the energy calculation and bit allocation process for the both transmit and receive logic blocks must initialize the bit allocation parameters $A(i)$ by setting them to a minimum value. Hence, step 402 sets the band counter i to band 1, wherein i varies from 1 to N. Step 403 sets bit allocation i to the minimum bit allocation AMIN. This step is performed by some sub-band coding implementations so as to ensure that every band gets coded with at least a minimum number of bits per sample, i.e., one. However, in the preferred embodiment, AMIN is set equal to zero, since at low data rates, a non-zero AMIN cannot be supported.

In step 404, the quantized energy values $Q(i)$ are obtained. On the transmit logic side, energy calculator 320 first measures the energy $E(i)$ of each band, then codes the energy measurements to obtain $C(i)$. As previously mentioned, these energy codes $C(i)$ are sent to the multiplexer for transmission over the channel. The transmitter logic block then decodes these energy codes $C(i)$ to obtain decoded energy values $Q(i)$, which will be used for the bit allocation process and sub-band sample coding. The decoded energy values $Q(i)$ are used in place of $E(i)$, since both the transmitter and receiver have the $Q(i)$ information as determined from the transmitted energy codes $C(i)$. Hence, for the transmit logic block, step 404 performs the equation:

$$Q(i) = QUANT[E(i)],$$

wherein QUANT is the quantizer coding function. Refer to "Comparison of Sub-Band Coding and Adaptive Predictive Coding for Land Mobile Radio" by M. McLaughlin, *Nordic Seminar on Digital Land Mobile*

*Radiocommunication,* Feb. 5-7, 1985, pp. 115-124, for a discussion of Delta coding quantization.

On the receive logic side, the energy codes C'(i) are received. Therefore, step 404 for the receive logic block simply decodes C'(i) to obtain the quantized energy values Q'(i). Once the sub-band energy for channel i has been obtained, it is stored for later use. At the receiver, note that the reconstructed versions of the energy codes C(i), the quantized energy values Q(i), and the bit allocation parameters A(i) are designated herein as C'(i), Q'(i), and A'(i), respectively, to indicate possible errors in transmission. Only the first designation is used in FIG. 4, however, since this flowchart represents the general operation of both the transmit and receive logic blocks. Also note that if no channel errors are present, then C(i)=C'(i), and hence Q(i)=Q'(i).

Step 405 increments the band counter i, and step 406 tests whether the parameters for all N bands have been initialized. If i is not greater than N bands, then control returns to step 403. Otherwise, control proceeds to step 407, which begins the bit allocation process.

The variable TBITS in step 407 represents the total number of bits which can be allocated to the sample coding, while the variable NBITS represents the bits remaining to be allocated once the initialization process has been performed. If the variable AMIN is equal to zero, as in the preferred embodiment, then NBITS will equal TBITS. Otherwise, the number of bands, N, is multiplied by the minimum number of bits which was allocated to each band, AMIN, and subtracted from the total number of bits which can be allocated to the samples, TBITS. For example, if it is determined that one bit must be allocated to each of 14 bands, then the total number of sample bits must be decreased by 14 to obtain the total number of bits remaining to allocate.

Since the bits are allocated on proportion to the band energies, the band having the highest energy must be found. Step 408 sets bit counter variable l to 1, in order to keep track of the number of bits allocated. Step 409 initializes the variable XMAX, representing the energy of the band having the highest energy, to −1, since no band will have a negative energy. The band counter i is then set equal to −1 in Step 410.

Decision step 411 tests to see if Q(i), the quantized energy value for band i, is greater than the previous maximum energy value stored in XMAX. If XMAX is greater than Q(i), the present band is not the one having the highest energy, and control proceeds to step 415 to test the next band. If band i does represent the highest energy thus far, then control proceeds to step 412 to test whether AMAX, the maximum number of bits allocatable to any one band, has been reached. If this is the case, the bit allocation A(i) cannot be increased, and again control proceed to step 415. If A(i) is not greater than AMAX, then XMAX is set equal to Q(i), the quantized energy in the present band, in step 413. Step 414 sets the variable LMAX, representing the location of the new maximum-energy band, to the present band i. Step 415 increments the band counter i, and step 416 checks to see if all N bands have been processed. If all N bands were checked, then LMAX represents the location of the band with the most energy. Thus, step 417 increases A(LMAX), the bit allocation for this band, by one bit.

Since an extra bit has now been allocated to the energy code for band LMAX, the energy value for band LMAX must be changed. In order to understand the operation of step 418, recall that the purpose of dynamic bit allocation is to assign a number of bits for sample coding to a band which is proportional to the amount of energy in that band. One method of accomplishing this process is to assign one bit to the maximum energy band, decrease the energy value for that band by some factor, and repeat the process by again looking for the new maximum energy band. Since PCM coding a sample will increase the signal-to-noise ratio by 6 dB for each additional bit allocated, the energy is usually decreased by dividing the energy value by a factor of 4. However this division factor can be arbitrarily set by any mechanism designed to increase speech quality. This operation is shown in step 418 where Q(LMAX) is divided by BIAS[A(LMAX)]. In the preferred embodiment, this BIAS function value is always equal to 4—except when A(LMAX)=AMAX−1 when it is equal to 8. The effect of this step is to limit the maximum bit allocation to AMAX−1, except when a band has a significantly larger energy than the other bands. In that case, the band is allocated another bit. This latter condition can happen if signalling tones are transmitted rather than speech, and it is desired to reproduce the tones with sufficient precision.

Step 419 increments the bit counter l such that step 420 can test whether or not all NBITS have been allocated. If l is not greater than NBITS, control returns to step 409 to allocate additional bits. If all NBITS have been allocated, the final bit allocation array A(i) is used to compute CRC(tx) or CRC(rx) in step 421. Thus, step 421 differs for transmit logic 130 versus receive logic 180. Accordingly, the flowchart of FIG. 5 illustrates the sequence of steps performed by transmit logic 130 in computing CRC(tx) in step 421, while the flowchart of FIG. 6 illustrates the steps performed by receive logic block 180 in computing CRC(rx) and making the error decision.

Figure 5A:
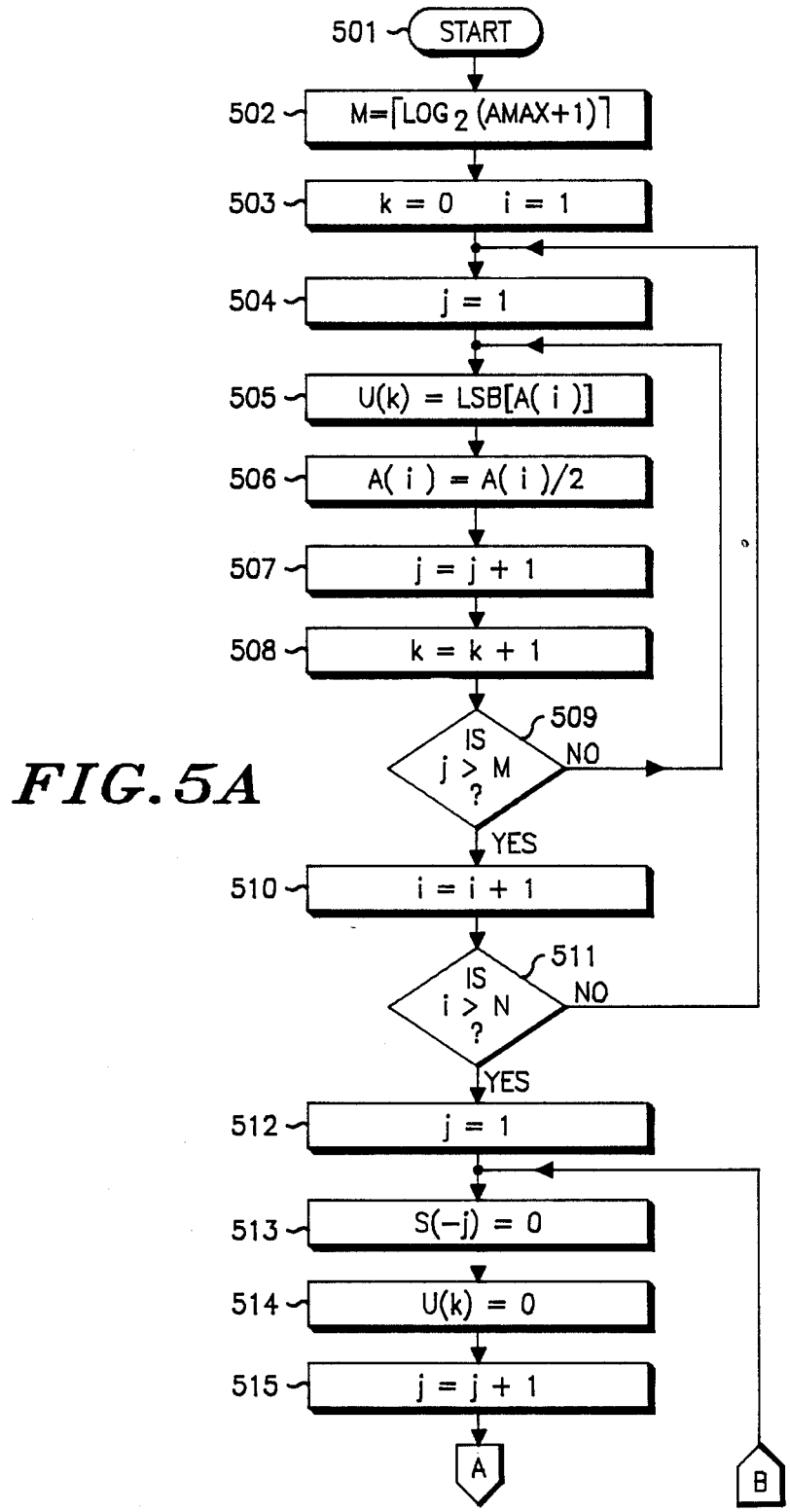
FIG. 5, comprised of FIGS. 5A and 5B, is a detailed flowchart diagram illustrating the sequence of steps performed in computing the CRC code (Step 421 of FIG. 4) for the transmit logic block.
Figure 5B:
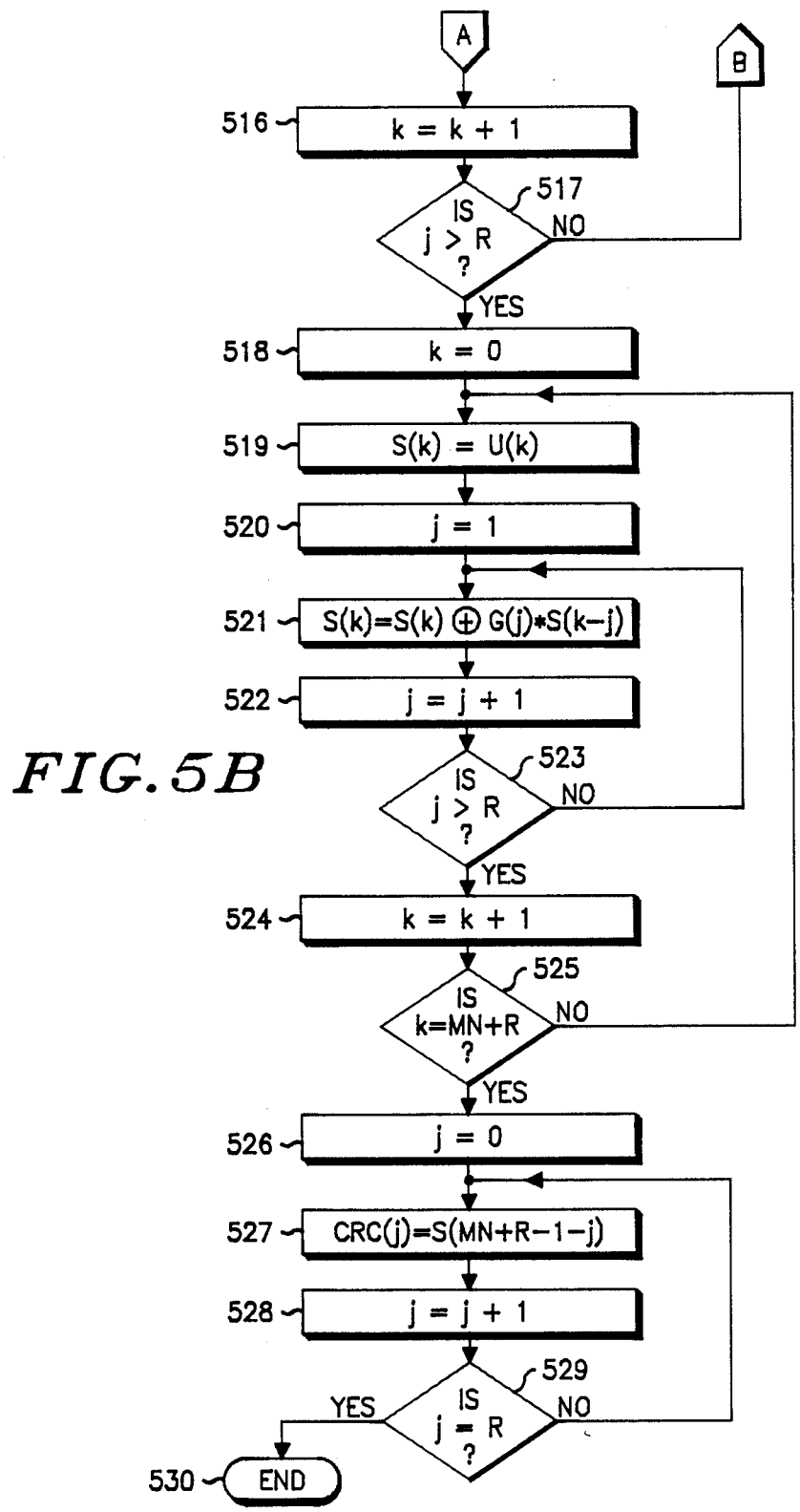
Figure 6A:
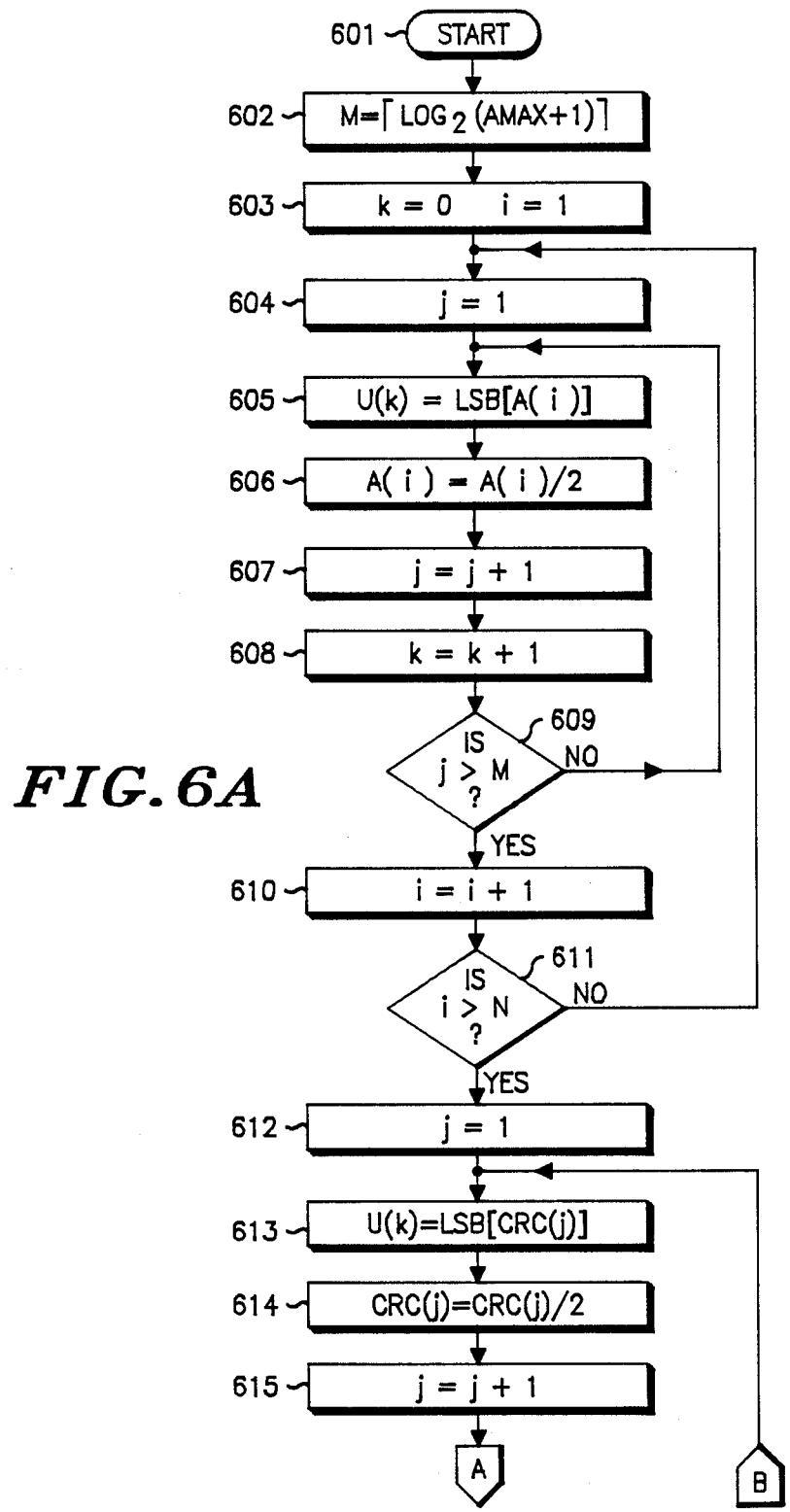
FIG. 6, comprised of FIGS. 6A, 6B and 6C, is the corresponding flowchart to FIG. 5 for the CRC computation step for the receive logic block.
Figure 6B:
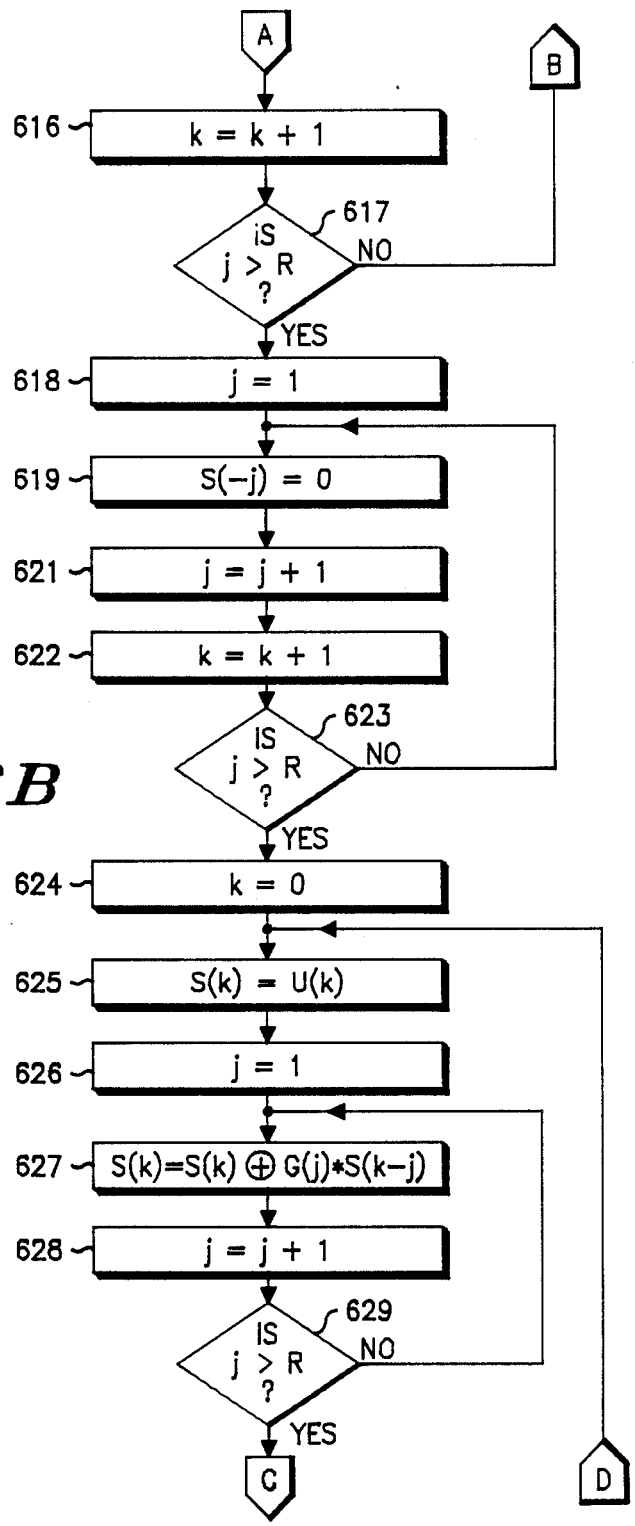
Figure 6C:
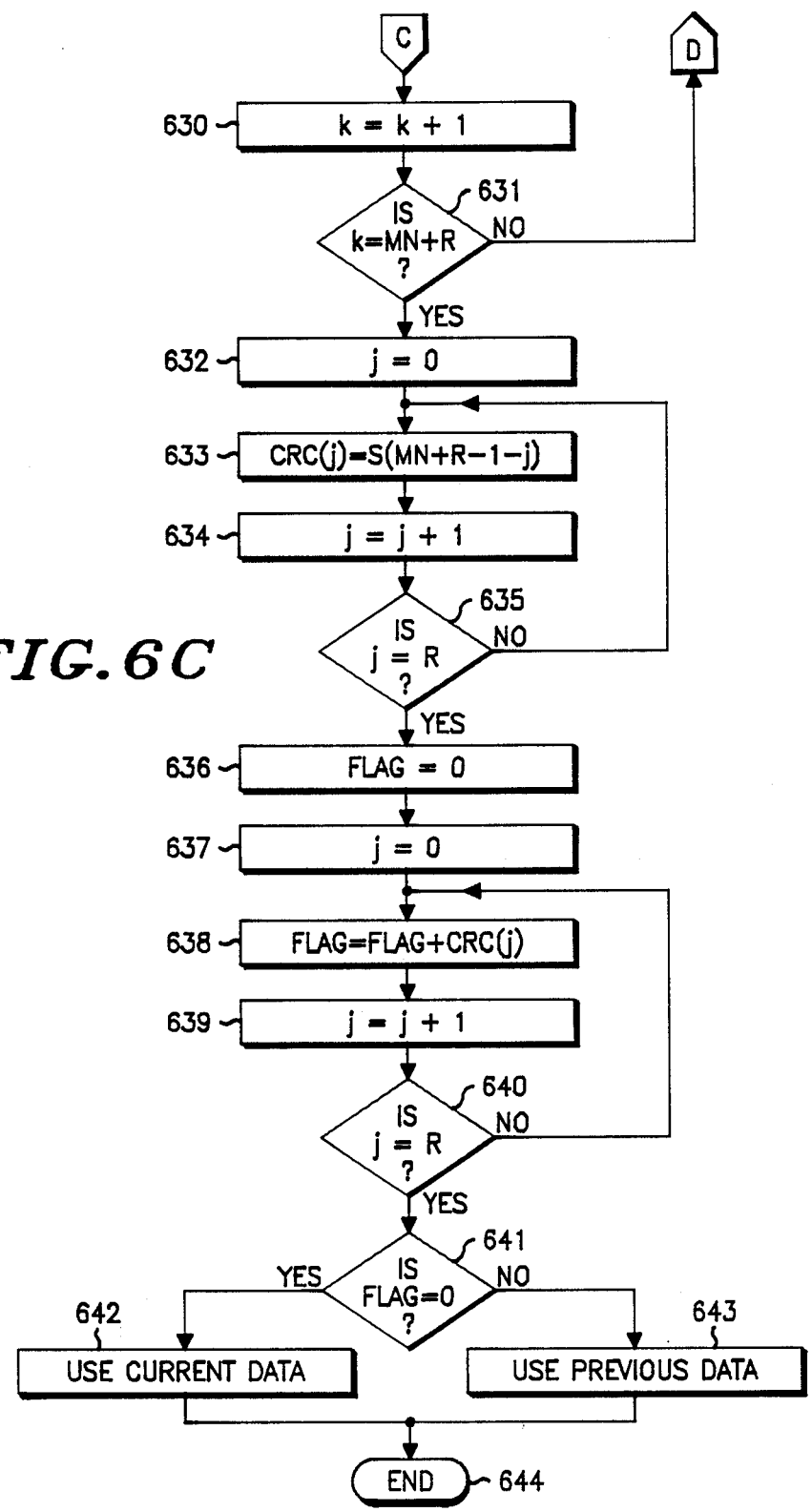

FIG. 5 illustrates the calculation of CRC(tx) as performed by CRC generator 340. Following start step 501, step 502 calculates the minimum number of bits M needed to represent all possible bit allocations for any particular sub-band, according to the equation:

$$M = \lceil LOG_2(AMAX+1) \rceil$$

wherein $\lceil LOG_2(AMAX+1) \rceil$ represents the smallest integer greater than or equal to $LOG_2(AMAX+1)$. For example, if AMAX equals 3, then M equals 2, such that two bits would be needed to represent the bit allocation for that band.

Step 503 sets bit pointer k to zero, and sets band counter i to 1. Step 504 sets bit counter j equal to 1. Bit pointer k varies from zero to the total number of bits needed to represent all bit allocations in all N bands, i.e., 14 bands times 2 bits/band equal 28 serial bits in the preferred embodiment. In step 505, the $k^{th}$ bit of serial bit stream U(k) is calculated by finding the least significant bit (LSB) of the bit allocation for band i. Step 506 puts the next least significant bit into the LSB position for the next calculation by dividing A i) by 2, which is the equivalent of performing a "shift right". Step 507 increments the bit counter j, and step 508 increments the bit pointer k. Decision step 509 tests whether all M bits have been taken from this bit allocation A(i). For example, if this inner loop was performed two times, j would equal 3, and then would exceed a value of M representing two bits per bit allocation. If all the bits have been taken from bit allocation A(i), then the band counter i is incremented in step 510, and tested in step 511. Hence, the function of putting all the bit allocations into a serial bit stream format U(k) is performed for all the bands. When this is accomplished, control proceeds to step 512.

The bit counter j is again set equal to 1 in step 512, and a shift register array S(−j) is set equal to zero in step 513. The shift register array S(−j) is used in the calculation of the CRC as shown below. Setting S(−j) equal to zero performs the function of initializing the first R bits of the shift register array to zeros. Step 514 sets the serial bit stream value U(k) to zero in the last R positions so as to calculate the last R elements of the shift register array correctly.

Steps 515 and 516 increment the variables j and k, respectively, and step 517 tests to see whether the bit counter j has exceeded R, the total number of bits in the CRC shift register array. In the preferred embodiment, R equals 8-bits. If j does not exceed R, control returns to step 513 to repeat the loop. After R iterations, R number of zeros have been inserted after the bit application information in serial bit stream U(k). This step is required to perform the CRC calculation below. In the preferred embodiment, serial bit stream U(k) now contains 28 bits of the serial bit allocations, followed by 8 zero bits.

At step 518, the bit pointer variable k is again initialized to zero. Step 519 loads bit k of the serial bit stream U(k) into bit k of the shift register array S(k). The shift register array bit counter j is then set equal to 1 in step 520. The CRC calculation is performed in step 521 using the S(k) array according to the equation:

$$S(k) = S(k) \oplus G(j) * S(k-j),$$

wherein G(j) represents a fixed tap weight for each bit j, and $\oplus$ is the exclusive-or function. In the preferred embodiment, G(j) represents either a one or a zero. Refer to Chapter 13 of *Technical Aspects of Data Communication* by J. E. McNamara, Second Edition, 1982, Digital Press, Bedford, Mass., for a detailed discussion of CRC calculations using generator polynomials.

The shift register array bit counter j is then incremented in step 522, and tested in step 523 to see if all R of the tap-weighted terms have been incorporated into S(k). If not, control returns to step 521. If j is greater than R, control proceeds to step 524 to increment the bit pointer k. Decision step 525 tests whether the bit pointer k is equal to MN, the minimum number of bits needed to represent all the bit allocations for the N bands, plus R, the number of bits in the CRC code. If k has not yet reached MN+R, then control returns to step 519 to calculate the next shift register array value.

At step 526, all the shift register array values S(k) have been calculated. The actual CRC code generation is performed by initializing the shift register array bit counter j to 0 in step 526, and calculating CRC(j) according to the equation $$CRC(j) = S(MN + R - 1 - j).$$

In the preferred embodiment where an 8-bit CRC code is used, j would vary from 0 to 8, such that when incremented in step 528 and tested in step 529, the calculation in step 527 would be performed 8 times. Hence, the CRC code represents the last eight bits of the shift register array S(k). Control ends at step 530, wherein CRC(tx) is now available to be sent to the multiplexer.

The flowchart of FIG. 6 illustrates the sequence of steps performed by the CRC computation and error detection step 421 of FIG. 4 for receive logic block 180. Steps 601 through 611 are identical to steps 501 through 511, respectively, performed by transmit logic block 130. Hence, these energy calculation/bit allocation steps need not be further described.

Steps 612 through 617 were added so as to take the additional R-bit CRC′(tx) code into the serial bit stream U(k). In step 612, the bit counter is set equal to 1. Step 613, using the previous value of bit pointer k, loads the least significant bit of the received CRC′(tx) code into the serial bit stream. A "shift right" is performed in step 614 as before, and steps 615 and 616 increment the bit counter variable j and the bit pointer variable k, respectively. When all R bits of the received CRC code have been loaded into the serial bit stream U(k), control proceeds to step 618.

Steps 618 through 623, which initialize the shift register array and serial bit stream, are identical to steps 512 through 517, respectively, with one minor exception: step 620, which would correspond to step 514 to set U(k)=0, has been omitted. This step is not required in the receiver, since the R-bit CRC′(tx) code was loaded into U(k) via the addition of steps of 612 through 617 above. Similarly, steps 624 through 631, which compute the shift register array S(k), are the same as steps 518 through 525. Then steps 632 through 635 compute the CRC(rx) code over both the bit allocations and the received CRC′(tx) code, similar to what was done in steps 526 through 529.

Once the second CRC(rx) code has been generated over the bit allocations and the received CRC′(tx) code, the remaining steps of FIG. 6 serve to see if any error have occurred. The CRC(rx) code will be equal to zero if no errors are present. This function is performed by error decision logic block 380 of FIG. 3.

Step 636 sets a variable FLAG to zero, and step 637 sets the bit counter variable j to zero. In step 638, the variable FLAG is incremented by bit j of the CRC(rx) code. Note that if no error has occurred, bit j of the CRC(rx) code will be equal to zero, such that step 636 does not change the FLAG. Step 639 increments the bit counter j, and step 640 re-routes control to test all R bits of the CRC(rx) code.

Next, step 641 tests whether the FLAG variable is equal to zero. If it is, no errors have occurred in transmission of the energy information which would cause the reconstructed bit allocations to be incorrect. Hence, decision step 641 routes control to step 642, which instructs the demultiplexer to use the current frame of speech. If errors have occurred in the transmission of the energy information which caused the bit allocations to be corrupted, the FLAG will not be equal to zero. In that case, step 643 instructs the demultiplexer to discard the current frame of speech and use the previous frame in its place. Alternatively, the frame could just be muted from the audio. Control ends at step 644.

In review, it can now be seen that the present invention provides error detection capabilities for the most critical parameters of the sub-band coded signal, i.e., the bit allocation information. This technique provides a highly reliable indicator to receive intelligible speech in the presence of channel errors. Moreover, since only a few number of error detection bits are added, and the bit allocation information itself is never transmitted, the present invention achieves effective error control without requiring significant number of overhead error protection bits.

While only particular embodiments of the invention have been shown and described herein, it will be obvious that further modifications may be made without departing from the invention in its broader aspects and, accordingly, the appended claims are intended to cover all such changes and alternative constructions that fall within the true scope and spirit of the invention.

What is claimed is:

1. A method of improving the quality of a signal communicated via sub-band coding comprising the steps of:
    generating original bit allocation parameters in response to sub-band coded input signal samples;
    calculating an error detection code based substantially upon said original bit allocation parameters;
    transmitting and receiving said error detection code with the sub-band coded signal samples;
    reconstructing the bit allocation parameters for the received sub-band coded signal samples;
    detecting errors in said reconstructed bit allocation parameters based upon said received error detection code.

2. The method according to claim 1, wherein said error detection code is a cyclic redundancy check (CRC) code.

3. The method according to claim 1, wherein said error detection code is based only upon said original bit allocation parameters.

4. The method according to claim 1, wherein said original bit allocation parameters ar not transmitted.

5. The method according to claim 1, further comprising the step of reconstructing an output signal from said received sub-band coded signal samples and said reconstructed bit allocation parameters.

6. The method according to claim 5, further comprising the step of excluding particular received sub-band coded signal samples from said output signal in response to said error detecting step.

7. A sub-band coding system comprising: a transmitter including:
    means for separating an input signal into a plurality of sub-band signals;
    means for determining the energy of each of said sub-band signals and for producing a plurality of energy codes in response thereto;
    means for generating bit allocation parameters in response to said energy codes;
    means for encoding said sub-band signals into sample codes in response to said bit allocation parameters;
    means for constructing a first error detection code based upon said bit allocation parameters;
    means for transmitting said sample codes, said energy codes, and said first error detection code;
and a receiver including:
    means for receiving said sample codes, said energy codes, and said first error detection code;
    means for generating received bit allocation parameters in response to said received energy codes;
    means for conducting a second error detection code based upon said received bit allocation parameters; and
    means for comparing said first error detection code to said second error detection code such that transmission errors are detected.

8. The sub-band coding system according to claim 7, wherein said separating means comprises a bank of parallel, substantially non-overlapping, bandpass filters covering the desired speech spectrum.

9. The sub-band coding system according to claim 7, wherein said encoding means is a pulse-coded modulation coder.

10. The sub-band coding system according to claim 7, wherein said first error detection code constructing means generates a cyclic redundancy check (CRC) code.

11. The sub-band coding system according to claim 7, wherein said first error detection code is based only upon said bit allocation parameters.

12. The sub-band coding system according to claim 7, wherein said transmitting means does not transmit said bit allocation parameters to said receiver.

13. The sub-band coding system according to claim 7, wherein said second error detection code constructing means generates a cyclic redundancy check (CRC) code.

14. The sub-band coding system according to claim 7, wherein said second error detection code is further based upon said received first error detection code.

15. The sub-band coding system according to claim 7, further comprising:
    means for reconstructing a speech signal from said received sample codes and said received bit allocation parameters; and
    means for excluding particular received sample codes from said reconstructed speech signal in response to said comparing means detecting transmission errors.

16. The sub-band coding system according to claim 15, wherein said speech signal reconstructing means includes means for decoding said sample codes into a plurality of received sub-band signals in response to said received bit allocation parameters.

17. The sub-band coding system according to claim 16, wherein said speech signal reconstructing means includes means for combining said plurality of received sub-band signals into said reconstructed speech signal.

18. The sub-band coding system according to claim 15, wherein said excluding means includes means for substituting previous received sample codes for said excluded sample codes such that no gap remains in the reconstructed speech signal.

19. A method of error control for a sub-band coding system comprising the steps of:
    separating an input signal into a plurality of sub-band signals;
    determining the energy of each of said sub-band signals;
    producing a plurality of energy codes in response to the energy of each of said sub-band signals;
    generating bit allocation parameters in response to said energy codes;
    encoding said sub-band signals into sample codes in response to said bit allocation parameters;
    constructing a first error detection code based upon said bit allocation parameters;
    transmitting said sample codes, said energy codes, and said first error detection code;
    receiving said sample codes, said energy codes, and said first error detection code;
    generating received bit allocation parameters in response to said received energy codes;
    constructing a second error detection code based upon said received bit allocation parameters; and comparing said first error detection code to said second error detection code such that transmission errors are detected.

20. The method according to claim 19, wherein said first error detection code is a cyclic redundancy check (CRC) code.

21. The method according to claim 19, wherein said first error detection code is based only upon said bit allocation parameters.

22. The method according to claim 19, wherein said transmitting step does not transmit said bit allocation parameters.

23. The method according to claim 19, wherein said second error detection code is a cyclic redundancy check (CRC) code.

24. The method according to claim 19, wherein said second error detection code is further based upon said received first error detection code.

25. The method according to claim 19, further comprising the steps of:
reconstructing a speech signal from said received sample codes and said received bit allocation parameters; and
excluding particular received sample codes from said reconstructed speech signal in response to said comparing step detecting transmission errors.

26. The method according to claim 25, wherein said speech signal reconstructing step includes the step of decoding said sample codes into a plurality of received sub-band signals in response to said received bit allocation parameters.

27. The method according to claim 25, wherein said excluding step includes the step of substituting previous received sample codes for said excluded sample codes such that no gap remains in the reconstructed speech signal.

28. A digital encoder having error detection code generation capabilities comprising:
means of inputting a plurality of input samples representative of a desired signal;
means for measuring the energy of said plurality of input samples;
means for quantizing the measured energy into digital energy codes;
means for generating bit allocation parameters in response to said energy codes;
means for encoding said plurality of input samples into sample codes in response to said bit allocation parameters and said energy codes;
means for constructing an error detection code based substantially upon said bit allocation parameters;
means for outputting said sample codes, said energy codes, and said error detection code.

29. The digital encoder according to claim 28, wherein said encoding means is a pulse-coded modulation coder.

30. The digital encoder according to claim 28, wherein said first error detection code constructing means generates a cyclic redundancy check (CRC) code.

31. The digital encoder according to claim 28, wherein said first error detection code is based only upon said bit allocation parameters.

32. The digital encoder according to claim 28, wherein said outputting means does not output said bit allocation parameters.

33. A digital decoder having error detection code checking capabilities comprising:
means for inputting a plurality of sample codes and energy codes representative of a desired signal, and an error detection code based substantially upon original bit allocation parameters utilized in encoding the sample codes;
means for producing energy parameters in response to said plurality of energy codes;
means for generating reconstructed bit allocation parameters in response to said energy parameters;
means for checking said error detection code and for providing an error control signal indicative of whether errors have occurred in transmission; and
means for outputting said error control signal.

34. The digital decoder according to claim 33, wherein said input sample codes are pulse-coded modulation.

35. The digital decoder according to claim 33, wherein said input error detection code is a cyclic redundancy check (CRC) code.

36. The digital decoder according to claim 33, wherein said input error detection code is based only upon said original bit allocation parameters.

37. The digital decoder according to claim 33, wherein said inputting means does not input said original bit allocation parameters.

38. The digital decoder according to claim 33, wherein said error detection code checking means generates a cyclic redundancy check (CRC) code based upon said input error detection code.

39. The digital decoder according to claim 33, further comprising means for decoding said plurality of input sample codes in response to said reconstructed bit allocation parameters and said energy parameters.

* * * * *

UNITED STATES PATENT AND TRADEMARK OFFICE
CERTIFICATE OF CORRECTION

PATENT NO. : 4,831,624
DATED : May 16, 1989
INVENTOR(S) : Michael J. McLaughlin and Phillip D. Rasky It is certified that error appears in the above-identified patent and that said Letters Patent is hereby corrected as shown below:

In Col. 13, line 61, change "conducting" to --constructing--.

Signed and Sealed this

Thirteenth Day of February, 1990

Attest:

JEFFREY M. SAMUELS

*Attesting Officer*    *Acting Commissioner of Patents and Trademarks*